United States Patent [19]

Williams

[11] Patent Number: 4,904,200

[45] Date of Patent: Feb. 27, 1990

[54] TEST PROBE APPARATUS

[76] Inventor: Robert A. Williams, 55 Bounty Rd. East, Fort Worth, Tex. 76132

[21] Appl. No.: 348,721

[22] Filed: May 8, 1989

Related U.S. Application Data

[63] Continuation-in-part of Ser. No. 104,813, Oct. 1, 1987, Pat. No. 4,850,893, which is a continuation-in-part of Ser. No. 50,091, May 14, 1987, abandoned.

[51] Int. Cl.[4] .......................................... H01R 13/639
[52] U.S. Cl. ..................................................... 439/349
[58] Field of Search ......................... 439/345, 347–349; 285/82, 84–86, 314–316, 318

[56] References Cited

U.S. PATENT DOCUMENTS

| Re. 28,328 | 2/1975 | Williams | 339/91 |
|---|---|---|---|
| 2,939,728 | 6/1960 | Bitel | 285/315 |
| 2,983,978 | 5/1961 | Williams | 439/345 |
| 3,505,635 | 4/1970 | Williams | 339/91 |
| 4,174,146 | 11/1979 | Williams | 339/143 R |
| 4,355,854 | 10/1982 | Williams | 339/89 R |
| 4,364,624 | 12/1982 | Williams | 339/154 R |
| 4,422,704 | 12/1983 | Williams | 339/91 R |
| 4,525,016 | 6/1985 | Williams | 339/75 R |
| 4,602,123 | 7/1986 | Williams | 174/72 R |

FOREIGN PATENT DOCUMENTS 683011 3/1964 Canada ............................... 285/318

Primary Examiner—Joseph H. McGlynn
Attorney, Agent, or Firm—Arthur F. Zobal

[57] ABSTRACT

The test probe is formed by a tubular body member carrying electrical contacts at its front end. Latching members are pivotally coupled to the front end of the body member. Each latching member has a latching portion located rearwardly of the pivot point of the latching member. The latching portions have exterior threads for engaging the interior threads of a tested device opening. The latching members are located in a space between the body member and a shell. The shell has openings for receiving the latching portions. A movable sleeve located around the body member can move forward and rearward relative to the body member. The sleeve has openings for receiving the latching members, a front radial wall for contacting the latching members, and a tapered surface for receiving a spring. In the forward position of the sleeve, the spring forces the latching members outwardly for latching purposes. In the rearward position of the sleeve, the radial wall of the sleeve forces the latching members inwardly to the unlatched position.

11 Claims, 3 Drawing Sheets

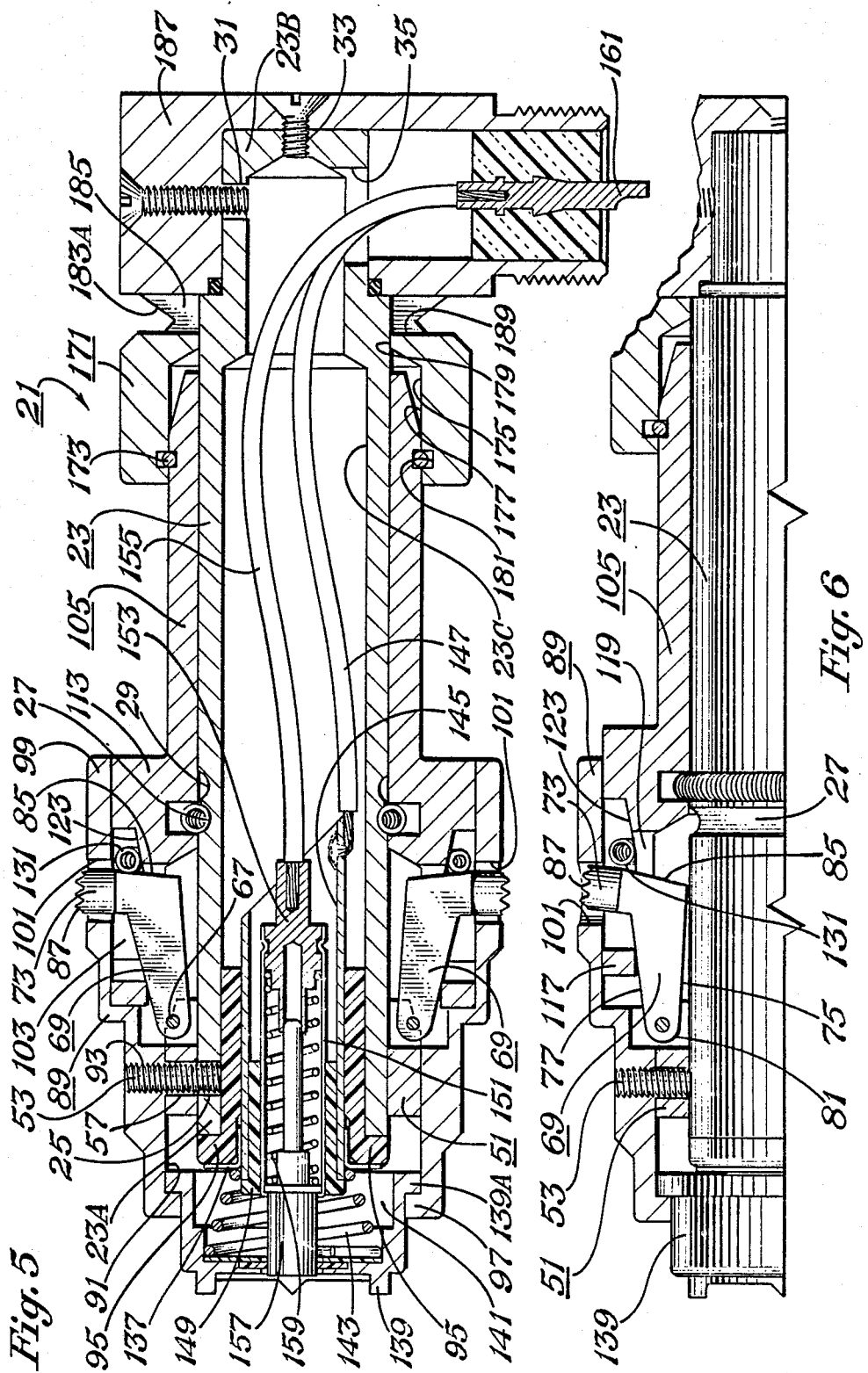

TEST PROBE APPARATUS

This application is a continuation-in-part of U.S. Pat. application Ser. No. 07/104,813, filed on October 1, 1987, now U.S. Pat. No. 4,850,893, which is a continuation-in-part of U.S. Pat. Applicaiton Ser. No. 07/050,091, filed on May 14, 1987.

BACKGROUND OF THE INVENTION

1. Field of the Invention

The invention relates to a latching apparatus for a test probe and also an apparatus in a test probe for routing electrical wires.

2. Description of the Prior Art

Ball and finger type latching mechanisms for latching a test probe in an opening of a device to be tested are well known, for example as disclosed in U.S. Pat. Nos. Re. 28,328 and 3,505,635. Springs have been employed in devices for locking or latching purposes, as shown in U.S. Pat. Nos. 4,355,854, and 4,422,704. U.S. Pat. Nos. 4,174,146, 4,364,624, 4,525,016 and 4,602,123 disclose different types of devices for routing electrical leads.

SUMMARY OF THE INVENTION

It is an object of the invention to provide a test probe apparatus having a unique latching mechanism for latching the test probe in an opening of a device to be tested.

It is another object of the invention to provide a test probe apparatus having a plurality of pivotally supported latch means with a unique and effective mechanism for moving the latch means to latching and release positions.

It is a further object of the invention to provide latching portions for the latch means which are uniquely constructed for latching onto internal threads of an apparatus.

It is another object of the invention to provide a test probe apparatus having a unique structural arrangement for routing electrical wires.

The test probe apparatus comprises a tubular body means having a front end and a rear end, structure including electrical contact means supported at the front end of the tubular body means, and electrical leads connected to the electrical contact means and extending through the tubular body means toward the rear end. Forward structure coupled to the front portion of the tubular body means forms a wall spaced from and surrounding the tubular body means and defines a surrounding space located between the wall and the tubular body means, which space has an opening facing rearward. A plurality of angularly spaced apart openings are formed through the wall. A movable sleeve means, movable between forward and rearward positions, is located around the tubular body means. At least the forward portion of the sleeve means is located for movement in the surrounding space. A plurality of latch means are located in the surrounding space and have coupling portions pivotally coupled to the forward structure at angularly spaced apart positions and latching portions located to move to outward and inward positions through the plurality of openings respectively. The latching portions are located rearward of the coupling portions. Engaging means is provided for engaging the plurality of latch means when the sleeve means is moved toward the forward position for moving the latching portions of the plurality of latch means outward through the plurality of openings for use for latching the test probe apparatus to structure of an opening. Retracting means is provided for retracting the latching means to their inward positions when the sleeve means is moved toward the rearward position.

In another aspect, the forward portion of the sleeve means comprises a surface located rearward of the plurality of latch means, which surface increases in radius from the axis of the tubular member in a direction toward the rear of the sleeve means. The engaging means comprises a ring shaped member located around the surface. The ring shaped member is of the type that can be expanded outward from its axis and when released it will retract inwardly. In a further aspect, a plurality of angularly spaced apart apertures are formed through the forward portion of the sleeve means. The plurality of latch means extend through the plurality of apertures respectively. Structure formed on the forward portion of the sleeve means engages the plurality of latch means when the sleeve means is moved toward the rearward position for moving the plurality of latch means to their inward positions.

DESCRIPTION OF THE DRAWINGS

FIG. 5 is a cross-sectional side view of the test probe, shown with the latching members in the latched position.

FIG. 6 is a cross-sectional partial side view of the test probe, shown with the latching members in the unlatched position.

DESCRIPTION OF THE PREFERRED EMBODIMENT

Figure 1:
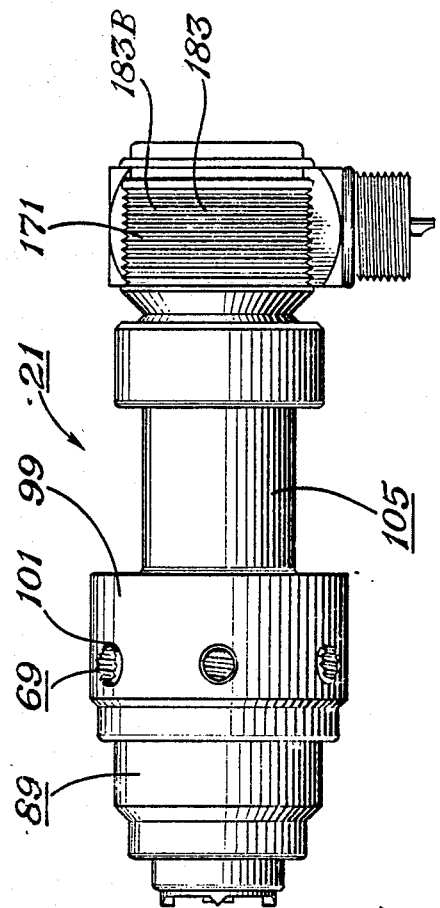
FIG. 1 is a side view of the test probe of the invention.
Figure 2:
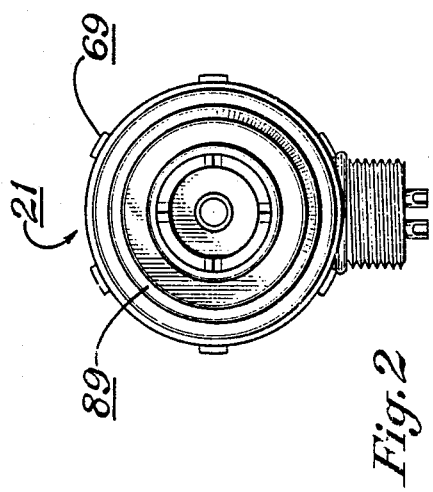
FIG. 2 is a front end view of the test probe of FIG. 1.

Referring to FIGS. 1 and 5, the test probe of the invention is identified at 21. It comprises a hollow cylindrical shaped body member 23 having a front end 23A, a rear end 23B, and a central cavity 23C. Three clearance apertures 25 (only one of which is shown) are formed through the wall of the body member 23 at its front end. The central portion of the body member 23 has two annular grooves 27 and 29 formed in its outside wall. An aperture 31 is formed through the side wall of member 23 at its rear end and a threaded aperture 33 is formed through its rear wall. A large opening 35 also is formed through the wall of member 23 at its rear end for the passage of electrical leads 147, 155.

Figure 7:
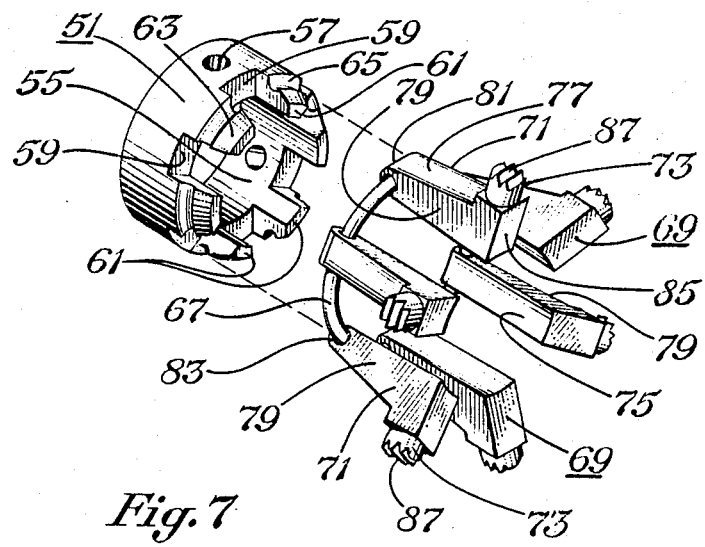
FIG. 7 is an isometric exploded view of the bushing and the latching members.

A bushing 51 is secured around the front end 23A of the body member 23 by set screws one of which is shown at 53. Referring to FIG. 7, the bushing 51 is annular with an axial opening 55 formed therethrough. Three clearance apertures 57 are formed through the bushing for receiving the set screws 53. The rear edge of the bushing has six spaced apart slots 59 formed forward of its rear edge to form six arms 61. The rear edges of the arms are tapered 63 to reduce their outside diameter. A circumferential groove 65 is formed in the arms, which groove receives a metal split ring 67.

The bushing 51 retains plural latching members 69 to the body member 23 in such a way so as to allow the latching members to pivot in and out in radial directions. Each latching member includes a coupling portion 71 and a latching portion 73. The coupling portion 71 is an elongated member with inner, outer, and side surfaces 75, 77, 79. The width of the coupling portion between the side surfaces 79 is narrow enough so that the forward end 81 of the coupling portion can be received by one of the slots 59 between two arms 61 on the bushing 51. The forward end 81 of the coupling portion has an aperture 83 formed between the side surfaces 79. The coupling portion is tapered such that the distance between the inner and outer surfaces 75, 77 increases from the forward end toward the rear surface 85. The rear surface 85 is roughly perpendicular to the inner surface 75; as shown in FIG. 6, the rear surface 85 is tapered from the outer portion of the latching member to the inner portion toward the front end 81. In the preferred embodiment, this taper is 7 degrees from an imaginary line oriented perpendicularly to the inner surface 75. The latching portion 73 is generally cylindrical and extends in a roughly perpendicular direction to the inner and outer surfaces 75, 77. The outer surface of the latching portion is threaded 87 to match the interior threads in the opening of the device which is to be tested.

The latching members 69 are all assembled onto the ring 67 as shown in FIG. 7. Then, the ring 67 is assembled into the groove 65 of the bushing 51, such that the forward ends 81 of the coupling portions 71 are received by the respective bushing slots 59. The bushing 51 is assembled onto the forward end 23A of the body member 23 such that the latching portions 73 are located rearwardly of the bushing 51.

The latching members 69 are fabricated and assembled so that the threads 87 on the outer surface of the coupling portions 73 will threadingly engage the interior threads of the tested device opening. In order for the threads 87 on the latching members 69 to threadingly engage the interior threads of the tested device opening, the threads on adjacent latching members, as coupled to the bushing 51, are positioned with respect to each other such that imaginary extensions of the threads on each latching member are aligned with the threads of the adjacent latching members. In the preferred embodiment, the latching members are fabricated from a rod, which rod is threaded on its outside diameter. The exterior threads on the rod are sized so as to threadingly engage the interior threads of the tested device opening. After threading, the individual latching members are machined out of the rod. When assembling the latching members 69 onto the split ring 67, the arrangement of the individual latching members with respect to each other in the rod is preserved, in order to preserve the alignment of the threads between adjacent latching members.

Secured around the front part of the bushing 51 and hence to the front end 23A of the body member 23 is a shell member 89 which is cylindrical in shape having an opening 91 extending axially therethrough. The side wall of the shell member 89 has three threaded apertures 93 (only one of which is shown) formed therethrough for receiving the set screws 53. The centers of adjacent apertures 25 of body member 23 are 120 degrees apart; the centers of adjacent apertures 57 of the bushing 51 are 120 degrees apart; and the centers of adjacent apertures 93 of the shell 89 are 120 degrees apart whereby the three set screws 53 secure the bushing 51 and the shell 89 to the body member 23. The set screws 53 when screwed into the apertures 93 of the shell 89 extend through the apertures 57 and 25 of the bushing 51 and of the body member 23 and bear against a tubular insert 95, holding it and the shell 89 and bushing 51 in place to the body member 23, as shown. The front end of the shell member 89 has an inward extending annular lip 97. The shell 89 has a rearward wall 99, which has six circular openings 101 for receiving the latching portions 73 of the latching members 69. When the shell 89 is assembled onto the body member 23, a space 103 is formed between the rearward wall 99 and the body member 23, which space has an opening facing rearward. The latching members 69 are located in the space 103.

Figure 4:
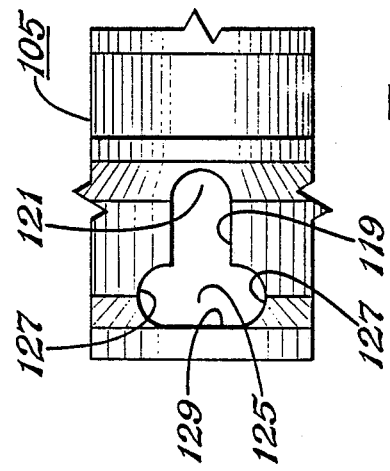
FIG. 4 is a detail view of one of the sleeve openings, taken through lines 4—4 of FIG. 3.
Figure 3:
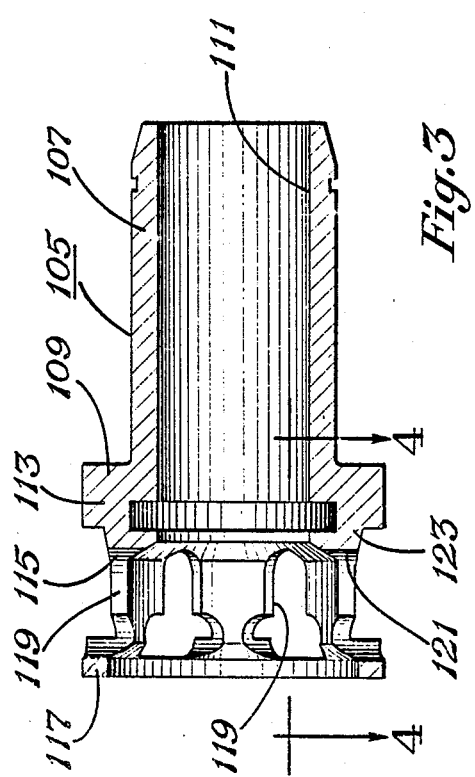
FIG. 3 is a cross-sectional side view of the sleeve of the test probe.

An axially movable sleeve 105 is employed for expanding the latching members 69 radially outward to their latching portions and for releasing the latching members to their unlatched positions inside of the space 103. Referring to FIGS. 3 and 4, the sleeve 105 has a rearward portion 107, a forward portion 109, and an opening 111 extending axially therethrough. The rearward portion 107 is generally cylindrical. The diameter of the axial opening 111 in the rearward portion 107 is such that the body member 23 is matingly received. The diameter of the opening 111 in the forward portion 109 is larger, thus creating a space between the forward portion 109 and the body member 23, when the sleeve is assembled onto the body member which space receives portions of the latching members 69. The forward portion 109 has a radially extending flange 113 at its rearwardmost portion, which flange is integral with the rearward portion 107 of the sleeve 105. The forward portion 109 also has an intermediate wall 115 that extends forward from the flange 113. A radially extending wall 117 extends outwardly from the forward edge of the intermediate wall 115. The outside diameters of the radially extending wall 117 and the flange 113 are equal and are slightly less than the inside diameter of the shell rearward wall 99. The intermediate wall 115 has six spaced apart openings 119 for receiving the latching members 69. The openings 119 are generally elongated in a direction which is parallel to the central axis of the sleeve 105. The rearward ends 121 of the openings extend toward the flange 113. The outside diameter of the intermediate wall 115 increases from the rearward portion of the openings to the flange 113 to form a tapered surface 123. The forward ends 125 of the openings extend into the radial wall 117. The forward end 125 of each opening 119 is widened with notches 127 that extend circumferentially in both directions so as to form a flat surface 129 on the radial wall 117 at the opening. As will be described in more detail hereinafter, the radial wall 117 contacts the outer surface 77 of the latching members 69 to force the latching members inwardly when the sleeve 105 is moved to a rearward position; the flat surfaces 129 on the radial wall at the openings 119 increases the effectiveness of the radial wall in this operation.

Referring to FIGS. 5 and 6, when the sleeve 105 is assembled into the test probe 21, the forward portion 109 of the sleeve is located in space 103 between the shell rearward wall 99 and the body member 23, and the latching members 69 are received by the sleeve openings 119. The latching portions 73 of the latching members 69 are received by the openings 101 in the shell 89. A coil 131 is located on the outside diameter of the sleeve intermediate wall 115 between the latching members 69 and the flange 113 such that the coil is on the tapered surface 123 of the sleeve The coil 131 is formed of spring type metal wire helically wound to form a helical coil having two ends. The ends are connected together to form a toroidally shaped coil which can be expanded radially outward from its center. When released, the coil 131 will retract radially inward toward its normal position. The coil 131 may be of the type shown in FIG. 15 of U.S. Pat. Application Ser. No. 07/104,813.

The sleeve 105 may be moved to a rearward unlatched position, as shown in FIG. 6, or to a forward latched position, as shown in FIG. 5. In the unlatched position, the latching portions 73 of the latching members 69 are located inside of the shell openings 101 such that the threaded outer surface 87 of the latching portions do not protrude radially outward beyond the maximum diameter of the shell 89, as shown in FIG. 6. In this position, the latching members 69 are in the unlatched position. The radial wall 117 of the sleeve 105 prevents the latching members 69 from extending radially outward. The tension of the spring 131 causes it to move forward on the sleeve tapered surface 123, to seek the smallest outside diameter, until further movement is prevented by the latching members 69. The smallest outside diameter of the intermediate wall is slightly greater than the normal inside diameter of the spring 131.

When the sleeve 105 is moved forward to its latched position, the sleeve flange 113 moves closer to the latching members 69. The latching members 69 push the spring 131 closer to the flange 113, up the tapered surface 123, increasing the tension of the spring. The radial wall 115 also moves forward, thus allowing the latching members to pivot outwardly. The tensioned spring 131 contacts the tapered rear surface 85 of the latching members and forces the latching members 69 radially outward. The latching members 69 pivot radially outward about the ring 67 to a latched position, wherein the latching portion threads 87 extend radially outward beyond the maximum diameter of the shell 89, whereby the latching members 69 may latch the test probe 21 to the threaded inside wall of the opening of the tested device. Reference is made to U.S Pat. No. 3,505,635 for a disclosure of the wall of an opening to which the test probe may be latched.

To release the test probe from the opening, the sleeve 105 is moved to its rearward position, wherein, the radial wall 117 moves rearwardly along the outer surfaces 77 of the latching members 69, engaging and causing the latching members 69 to pivot inwardly to their unlatched position. The spring 131 moves forward relative to the sleeve 105 to reduce its tension.

The individual latching members 69 are pivoted about a point which is located forward of the threaded latching portions 73. This allows the test probe to be inserted into the opening of the tested device, regardless of which position the sleeve 105 is in. Thus, the latching members can be in their latched positions, as shown in FIG. 5, and still be inserted into the tested device opening, because the latching members will pivot inwardly, pushing the spring 131 closer to the flange 113 in order to ratchet past the interior threads of the tested device opening. When the test probe is pushed all the way into the opening, the spring 131 will force the latching members 69 back out to the latched positions. To insure that the threads 87 on the latching members have fully engaged the interior threads of the tested device opening, the test probe can be rotated about its central axis. Furthermore, if the latching members become jammed in their latched positions, with the test probe inserted into an opening, the test probe can be removed from the opening by unscrewing.

The angle between the central axis of the test probe and an imaginary line through the aperture 83 and the threads 87 of each latching member 69 is chosen to optimize the holding power of the latching members when engaging the interior threads of the tested device opening. For example, in the preferred embodiment, where the angle described by individual threads 87 is 60 degrees, the angle between the central axis and the imaginary line is 30 degrees. This insures that the direction of force exerted by the latching members 69 on the interior threads, when force is exerted on the test probe so as to pull the probe out of the opening, which force is along the imaginary line, is perpendicular to the thread surfaces of the tested device opening. Such perpendicular application of force to the thread surfaces utilizes the optimum holding power of the threads.

The sleeve 105 is retained in its forward and rearward positions along the body member 23 by a retaining spring 133 located in an interior groove 135 in the sleeve. The spring 133 is similar to the coil spring 131. When the sleeve 105 is in its rearward position, the retaining spring 133 is received by the rearward groove 29 on the body member 23 (see FIG. 6). When the sleeve is in its forward position (see FIG. 5), the retaining spring 133 is received by the forward groove 27.

The hollow tubular insert 95 formed of a suitable electrically insulating plastic material is located in the front end of the cavity 23C of the member 23. The insert 95 has a radially extending flange at its front end which seats against the front edge of member 23. A hollow metallic tubular member 137 is located in the front end of an enlarged diameter portion at the front end of the insert 95. Member 137 has a radially extending flange at its front end which seats against the front edge of the insert 95.

An annular electrical contact member 139, formed of metal, is provided at the front end of the probe 21 for forward and rearward movement The rear portion of the contact 139 is located for forward and rearward movement in the annular space 141 between member 23 and shell 89. The lip 97 of the shell 89 is adapted to engage an outward extending wall 139A of the contact 139 at its rear end for limiting forward movement of the contact. A metallic coiled spring 143 located against the inside wall of the contact 139 and against the flange of member 137 urges the contact outward and provides an electrical connection between the contact 139 and member 137. Member 137 makes electrical contact with a metallic tubular member 145 located in the opening of the insert 95 to which an electrical lead 147 is connected.

Secured within the tubular member 145 is an electrical insulating sleeve 149 which engages and holds a thin metal tubular member 151. The rear end of member 151 has metallic member 153 located and secured therein by crimping the thin wall of the tubular member 151 to member 153. The rear end of member 153 is connected to an electrical lead 155 and the other end has an aperture for slidably receiving the pin-like rear end of a central contact 157. The forward end of the contact 157 extends through a central aperture of the annular contact 139 without engagement thereof. A coiled metallic spring 159 has its front end tightly located around an intermediate portion of the contact 157 and its rear end engaging a forward facing wall of member 153 inside a tubular member 157. Coil 159 urges contact 157 in a forward position and provides electrical connection between contact 157 and member 153. A forward inward extending lip of tubular member 151 limits forward movement of the contact 157. Leads 147 and 155 extend rearward where they are connected to terminals 161 which extend out of the probe.

In using the test probe, its forward end is inserted into the opening or well formed in metal structure of an aircraft or other equipment such that its annular contact 139 engages the back wall of the opening and its central contact 157 is centered relative to an aperture formed through the back wall for engaging an electrical contact of circuitry of the aircraft to be tested.

The rear end portion of the sleeve 105 is connected to a grip member 171 by a split metal ring 173. The grip member 171 has a central opening 175 formed therethrough. The opening 175 comprises a forward portion 177 having an inside diameter sufficient to fit around the rear portion 107 of the sleeve 105 and a rear portion 179 having an inside diameter sufficient to fit around and slide freely on the tubular body member 23. An annular groove 181 is formed in the inside wall of the forward portion 177 for receiving the split ring 173. The rear portion 183 of the grip member 171 is bifurcated forming two spaced apart end members 183A and 183B and has a slot 185 therebetween. A block member 187 is located in the slot 185 whereby the end members will slide or move relative to the sides of the block member 187 as the sleeve 105 is moved between its forward position and its rearward position. In the rearward position of the sleeve 105, the forward end 189 of the slot 185 abuts against the block member 187 which limits rearward movement of the sleeve 105.

The foregoing disclosure and the showings made in the drawings are merely illustrative of the principles of the invention and are not to be interpreted in a limiting sense.

I claim:

1. A test probe apparatus, comprising:
   tubular body means having a front end and a rear end,
   structure including electrical contact means supported at said front end of said tubular body means,
   electrical leads connected to said electrical contact means and extending through said tubular body means toward said rear end,
   forward structure coupled to the front portion of said tubular body means forming a wall spaced from and surrounding said tubular body means defining a surrounding space located between said wall and said tubular body means and having an opening facing rearward,
   a plurality of angularly spaced apart openings formed through said wall,
   a movable sleeve means located around said tubular body means,
   said sleeve means being movable between forward and rearward positions,
   at least the forward portion of said sleeve means being located for movement in said surrounding space,
   a plurality of latch means located in said surrounding space and having coupling portions pivotally coupled to said forward structure at angularly spaced apart positions and latching portions located to move to outward and inward positions through said plurality of openings respectively,
   said latching portions being located rearward of said coupling portions,
   engaging means for engaging said plurality of latch means when said sleeve means is moved toward said forward position for moving said latching portions of said plurality of latch means outward through said plurality of openings for use for latching said test probe apparatus to structure of an opening,
   retracting means for retracting said latching means to their inward positions when said sleeve means is moved toward said rearward position.

2. The test probe apparatus of claim 1, wherein:
   said forward portion of said sleeve means comprises a surface located rearward of said plurality of latch means and which increases in radius from the axis of said tubular member in a direction toward the rear of said sleeve means, and
   said engaging means comprises a ring shaped member located around said surface,
   said ring shaped member being of the type that can be expanded outward from its axis and when released it will retract inwardly.

3. The test probe apparatus of claim 2 wherein said latching portions comprise exterior threads for engaging interior threads of said opening structure.

4. The test probe apparatus of claim 2, wherein:
   said ring shaped member comprises a helically wound spring member having two ends connected together forming a toroidal shaped spring member.

5. The test probe apparatus of claim 4 wherein said latching portions comprise exterior threads for engaging interior threads of said opening structure.

6. The test probe apparatus of claim 1, wherein:
   a plurality of angularly spaced apart apertures are formed through the forward portion of said sleeve means,
   said plurality of latch means extend through said plurality of apertures respectively,
   said retracting means comprising structure formed on the forward portion of said sleeve means for engaging said plurality of latch means when said sleeve means is moved toward said rearward position for moving said plurality of latch means to their inward positions when said sleeve means is moved to its rearward position.

7. The test probe apparatus of claim 2, wherein:
   a plurality of angularly spaced apart apertures are formed through the forward portion of said sleeve means,
   said plurality of latch means extend through said plurality of apertures respectively,
   said retracing means comprising structure formed on the forward portion of said sleeve means for engaging said plurality of latch means when said sleeve means is moved toward said rearward position for moving said plurality of latch means to their inward positions when said sleeve means is moved to its rearward position.

8. The test probe apparatus of claim 7 wherein said latching portions comprise exterior threads for engaging interior threads of said opening structure.

9. The test probe apparatus of claim 1, wherein:
   said sleeve means has a rear end which is bifurcated forming two spaced apart end members,
   a block member having a first opening formed into its side and a second opening formed in its end with said first and second openings intersecting each other, said rear end of said tubular body means being located in said first opening and secured to said block member with said block member being located in the space between said two spaced apart end members of said sleeve means such that said two end members move forward and rearward relative to said block member on opposite sides thereof as said sleeve means is moved between its forward and rearward positions, said rear end of said tubular body means having an opening formed therethrough in communication with said second opening of said block member forming a passage for said leads out of said tubular body means.

10. The test probe apparatus of claim 7, wherein:

said sleeve means has a rear end which is bifurcated forming two spaced apart end members, a block member having a first opening formed into its side and a second opening formed in its end with said first and second openings intersecting each other, said rear end of said tubular body means being located in said first opening and secured to said block member with said block member being located in the space between said two spaced apart end members of said sleeve means such that said two end members move forward and rearward relative to said block member on opposite sides thereof as said sleeve means is moved between its forward and rearward positions, said rear end of said tubular body means having an opening formed therethrough in communication with said second opening of said block member forming a passage for said leads out of said tubular body means.

11. A test probe apparatus comprising:

tubular body means having a front end and a rear end, structure including electrical contact means supported at said front end of said tubular body means, electrical leads connected to said electrical contact means and extending through said tubular body means toward said rear end, forward structure coupled to the front portion of said tubular body means forming a wall spaced from and surrounding said tubular body means defining a surrounding space located between said wall and said tubular body means and having an opening facing rearward, a plurality of angularly spaced apart openings formed through said wall, a movable sleeve means located around said tubular body means, said sleeve means being movable between forward and rearward positions, at least the forward portion of said sleeve means being located for movement in said surrounding space, a plurality of angularly spaced apart apertures being formed through the forward portion of said sleeve means, said apertures having forward wall means, a plurality of latch means located in said surrounding space and having coupling portions pivotally coupled to an annular member at angularly spaced apart positions, said annular member being coupled to said forward structure, said latch means having latching portions located to move to outward and inward positions through said plurality of wall openings respectively, said plurality of latch means extending through said plurality of sleeve means apertures respectively, said latching portions being located rearward of said coupling portions, engaging means for engaging said plurality of latch means when said sleeve means is moved toward said forward position for moving said latching portions of said plurality of latch means outward through said plurality of openings for use for latching said test probe apparatus to structure of an opening, said forward wall means of said sleeve means retracting said latching means to their inward positions when said sleeve means is moved toward said rearward position.

* * * * *